US008219944B2

(12) United States Patent
Song et al.

(10) Patent No.: US 8,219,944 B2
(45) Date of Patent: Jul. 10, 2012

(54) METHOD AND SYSTEM PERFORMING BLOCK-LEVEL RC EXTRACTION

(75) Inventors: Li J. Song, Fremont, CA (US); Zhan-Zhong Yao, San Jose, CA (US); Rachid Salik, Sunnyvale, CA (US); Hao Ji, San Jose (CN); Taber Smith, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 385 days.

(21) Appl. No.: 12/490,063

(22) Filed: Jun. 23, 2009

(65) Prior Publication Data
US 2010/0162188 A1 Jun. 24, 2010

Related U.S. Application Data

(60) Provisional application No. 61/075,324, filed on Jun. 24, 2008.

(51) Int. Cl.
*G06F 17/50* (2006.01)

(52) U.S. Cl. ........ 716/103; 716/104; 716/111; 716/122; 716/123; 716/130; 716/716; 716/132; 716/136

(58) Field of Classification Search .................. 716/103, 716/104, 111, 122, 123, 129, 130, 132, 136
See application file for complete search history.

(56) References Cited

U.S. PATENT DOCUMENTS

| | | | | |
|---|---|---|---|---|
| 5,621,653 A * | 4/1997 | Yuzawa | ........................ | 716/103 |
| 6,305,006 B1 * | 10/2001 | Markov | ......................... | 716/102 |
| 6,311,309 B1 * | 10/2001 | Southgate | ...................... | 716/102 |
| 6,317,860 B1 * | 11/2001 | Heile | ............................. | 716/102 |
| 6,470,482 B1 * | 10/2002 | Rostoker et al. | ............... | 716/102 |
| 6,530,073 B2 * | 3/2003 | Morgan | ......................... | 716/102 |
| 6,917,909 B1 * | 7/2005 | Markov et al. | .................... | 703/14 |
| 7,082,594 B1 * | 7/2006 | Milne et al. | ....................... | 716/103 |
| 7,086,029 B1 * | 8/2006 | Barras et al. | .................... | 716/103 |
| 7,231,337 B1 * | 6/2007 | Karchmer et al. | ............... | 703/15 |
| 7,363,599 B1 * | 4/2008 | Vogenthaler | .................... | 716/102 |
| 7,493,578 B1 * | 2/2009 | Milne et al. | .................... | 716/106 |
| 7,536,661 B1 * | 5/2009 | Singh et al. | ...................... | 716/135 |
| 7,600,208 B1 * | 10/2009 | Sharma et al. | ................. | 716/120 |
| 7,685,545 B2 * | 3/2010 | Chapman et al. | ............. | 716/136 |
| 7,730,437 B1 * | 6/2010 | Ramakrishnan et al. | ..... | 716/113 |
| 7,934,185 B1 * | 4/2011 | Ballagh et al. | .................. | 716/106 |
| 7,962,886 B1 * | 6/2011 | Pandey et al. | .................. | 716/136 |
| 7,966,598 B2 * | 6/2011 | Polomik et al. | ............... | 716/130 |
| 8,001,516 B2 * | 8/2011 | Smith et al. | ..................... | 716/136 |
| 2001/0016933 A1 * | 8/2001 | Chang et al. | ....................... | 716/1 |
| 2002/0162086 A1 * | 10/2002 | Morgan | ......................... | 716/18 |
| 2003/0009734 A1 * | 1/2003 | Burks et al. | ........................ | 716/6 |
| 2003/0041310 A1 * | 2/2003 | Chopra et al. | .................. | 716/12 |
| 2004/0025123 A1 * | 2/2004 | Angilivelil | ......................... | 716/4 |
| 2005/0132309 A1 * | 6/2005 | Saxena et al. | ..................... | 716/4 |
| 2005/0138590 A1 * | 6/2005 | Amundson et al. | ............. | 716/11 |
| 2005/0235240 A1 * | 10/2005 | Tien | ................................ | 716/11 |
| 2007/0011643 A1 * | 1/2007 | Wang et al. | ..................... | 716/18 |
| 2009/0031261 A1 * | 1/2009 | Smith et al. | ....................... | 716/2 |
| 2009/0210845 A1 * | 8/2009 | Malgioglio et al. | ............ | 716/11 |
| 2009/0300570 A1 * | 12/2009 | Chan | ................................ | 716/11 |
| 2009/0307640 A1 * | 12/2009 | Chapman et al. | ................. | 716/4 |

* cited by examiner

*Primary Examiner* — Phallaka Kik
(74) *Attorney, Agent, or Firm* — Vista IP Law Group LLP

(57) ABSTRACT

A method, system, and computer program product are disclosed for performing RC extraction from the perspective of the block level. A translation mechanism is employed to convert from a full-chip design domain to a block-level design domain. This allows model-based prediction results to be used in the early design implementation flow when parasitic RC and timing extractions are performed, where the model-based prediction results relate to predictions of manufacturing variations such as thickness and topography.

37 Claims, 7 Drawing Sheets

Top-Level Design View

Block Design View

METHOD AND SYSTEM PERFORMING BLOCK-LEVEL RC EXTRACTION

CROSS-REFERENCE TO RELATED APPLICATIONS

The present application claims the benefit of U.S. Provisional Application Ser. No. 61/075,324, filed on Jun. 24, 2008, which is hereby incorporated by reference in its entirety.

BACKGROUND AND SUMMARY

The invention is directed to an improved approach for designing, testing, and manufacturing integrated circuits.

A semiconductor integrated circuit (IC) has a large number of electronic components, such as transistors, logic gates, diodes, wires, etc., that are fabricated by forming layers of different materials and of different geometric shapes on various regions of a silicon wafer. Many phases of physical design may be performed with computer aided design (CAD) tools or electronic design automation (EDA) systems. In particular, an integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

Based upon this geometric information, photomasks are created for lithographic manufacturing of the electronic product. A photomask, or more simply a "mask," provides the master image of one layer of a given integrated chip's physical geometries. A typical photolithography system projects UV light energy on to and through the mask in order to transmit the mask pattern in reduced size to the wafer surface, where it interacts with a photosensitive coating on the wafer.

Other processes may also occur during the process of manufacturing an integrated circuit. For example, etching, electroplated copper deposition (ECD), and chemical mechanical polishing (CMP) may be used to form interconnects for the IC. The lithographic patterns define the dimensions of the circuitry that is transferred to a silicon wafer, with the patterns subsequently used with the etch process to physically etch the features into the wafer surface or other thin films deposited on the wafer surface. Etch equipment includes mechanisms to selectively remove materials (e.g. oxide) from a wafer surface or thin films on the wafer surface patterned with lithography equipment. ECD is a process step in a copper damascene flow that is used to deposit copper material within the interconnect structures.

However, significant variations may arise during the process of manufacturing the IC, such as variations in feature density, widths, and heights caused by lithography, etch, CMP, and/or deposition processes. For example, variations based upon CMP and deposition process are often caused by dielectric loss, dishing, erosion, or other metal losses.

One way to reduce the variations in fabricated chips is to use a pattern-dependent model to predict variations of feature dimensions of an integrated circuit. Pattern-dependent models can also be used to predict topological variations of an integrated circuit. Further details regarding one approach for implementing and using pattern-dependent models is disclosed in US Patent Publication 2003/0229412, filed on Dec. 11, 2003, entitled "Electronic design for integrated circuits based on process related variations," which is hereby incorporated by reference in its entirety.

At semiconductor manufacturing process node 65 nm and beyond, it becomes more and more useful for the designer to have access to accurate modeling of systematic variations, e.g., variations caused by manufacturing issues such as Chemical Mechanical Polishing (CMP), etch and lithography. These models are very useful at the design stage for achieving higher chip performance, yield, and time-to-volume.

Recently, modeling has been introduced to predict full chip wire thickness and chip surface topography variation (e.g. caused by the CMP process). It has been demonstrated that by using design-specific thickness profile predicted by a calibrated CMP model, resistance and capacitance (R and C) extraction values are more accurate compared to traditional approaches (e.g. using a fixed nominal or a rule-based thickness lookup table).

While model-based approaches are better than rule-based approaches in accounting for manufacturing variations, current uses of full-chip modeling are limited to the sign-off stage, when the design (including dummy metal fill) is completed. However, RC extraction is often used earlier in the design implementation flow on IP or macro blocks, where early timing closure is a key to a fast chip design. During the early-stage design phase, each IP or macro block is implemented independently, and the lack of full-chip information and the lack of sufficient time to repeatedly perform long simulations prevents full-chip models (e.g. CMP and etch) from being utilized to more accurately extract resistance and capacitance. Also, block designers typically think and operate in terms of their design, rather than from the perspective of the full-chip design.

SUMMARY OF THE INVENTION

The present invention is directed to a method, system, and computer program product for performing RC extraction from the perspective of the block level. A translation mechanism is employed to convert from a full-chip design domain to a block-level design domain. This allows model-based prediction results to be used in the early design implementation flow when parasitic RC and timing extractions are performed, where the model-based prediction results relate to predictions of manufacturing variations such as thickness and topography.

Other additional objects, features, and advantages of the invention are described in the detailed description, figures, and claims.

DETAILED DESCRIPTION

A method, system, and computer program product is disclosed for performing RC extraction from the perspective of the block level. A translation mechanism is employed to convert from a full-chip design domain to a block-level design domain, which allows model-based prediction results to be used in the early design implementation flow when parasitic RC and timing extractions are performed. As used herein, the term "model" refers to a set of data that identifies one or more specific characteristics within an IC design, layout, and/or data relating to its effect, manufacturability, and/or usability. Examples of such models include manufacturability models, CMP (chemical mechanical polishing) models, etch models, lithography models, and electrical models.

The general problem being addressed by some embodiments of the invention is that designers working at different granularities of the design will need to have different perspectives of the design data. A designer working at the full-chip level will have different requirements and criteria for performing analysis than a designer at the block level.

Figure 1B:
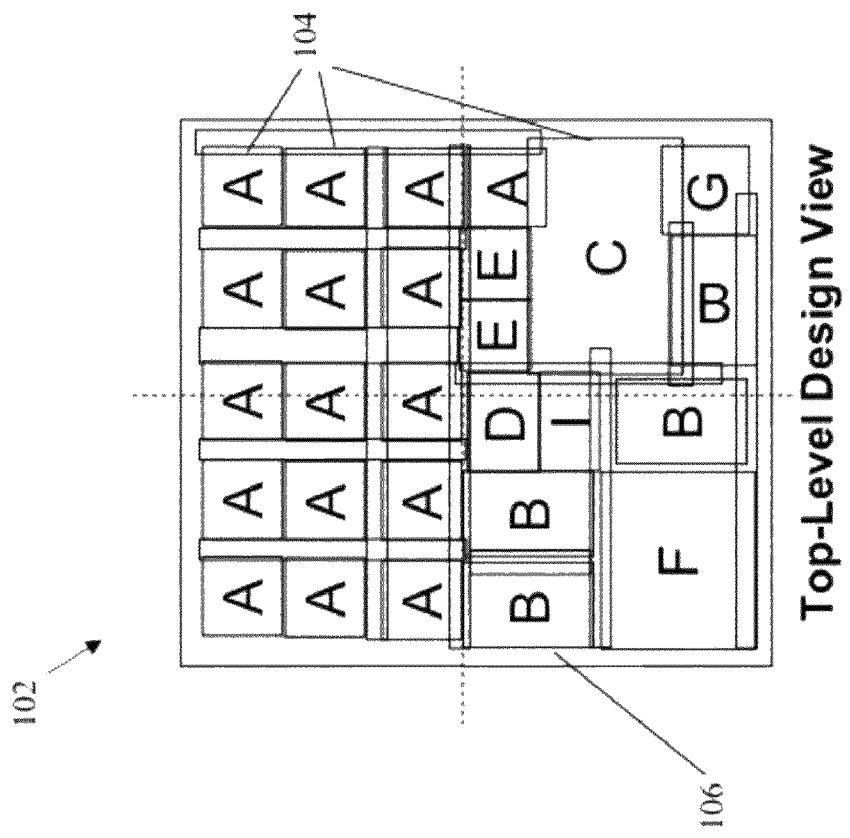
FIGS. 1A-B show a comparison between a chip-level domain and a block-level domain.
Figure 1A:
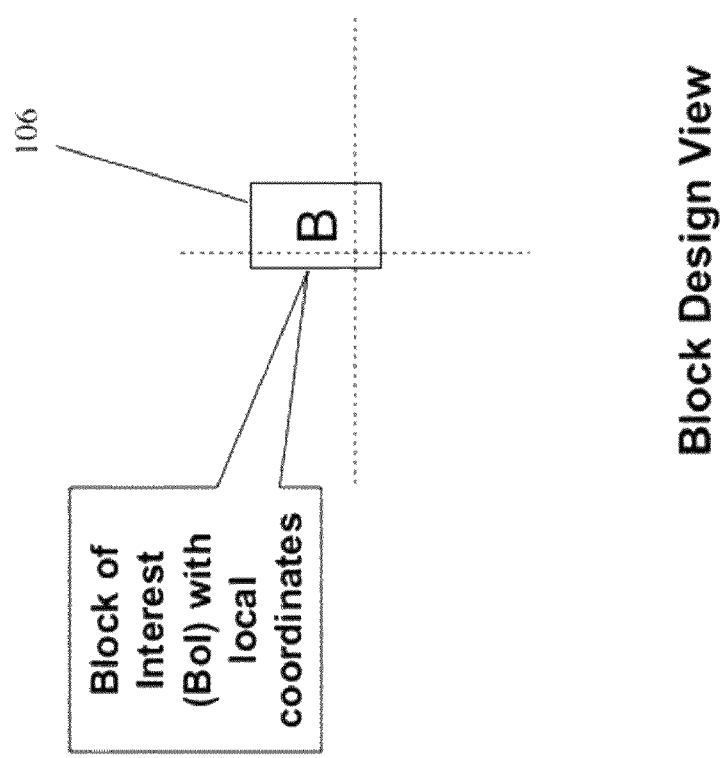

FIGS. 1A and 1B illustrate an example of this problem. FIG. 1B shows a top-level electronic design 102 having numerous design blocks and cells 104. The top-level design 102 is used for used for design activities at the full-chip level, e.g., geometry extraction and block locations. One of the blocks 106 shown in the top-level design is block "B". FIG. 1A shows only the block 106 "B" of interest ("BOI") that appears within the top-level design.

The design perspective used to work with and update block 106 "B" is likely to be quite different from the design perspective used to work with the top-level design 102. For example, the top-level design 102 likely corresponds to a coordinate system that is completely different from the coordinate system used for the block-level design. In particular, the top-level design 102 corresponds to the full-chip coordinate system, e.g., to determine a prediction grid and to specify location(s) of the blocks. Therefore, blocks are often transformed into their place within the full chip design. In contrast, the block-level design will operate with and utilize local block-level coordinates.

Figure 2:
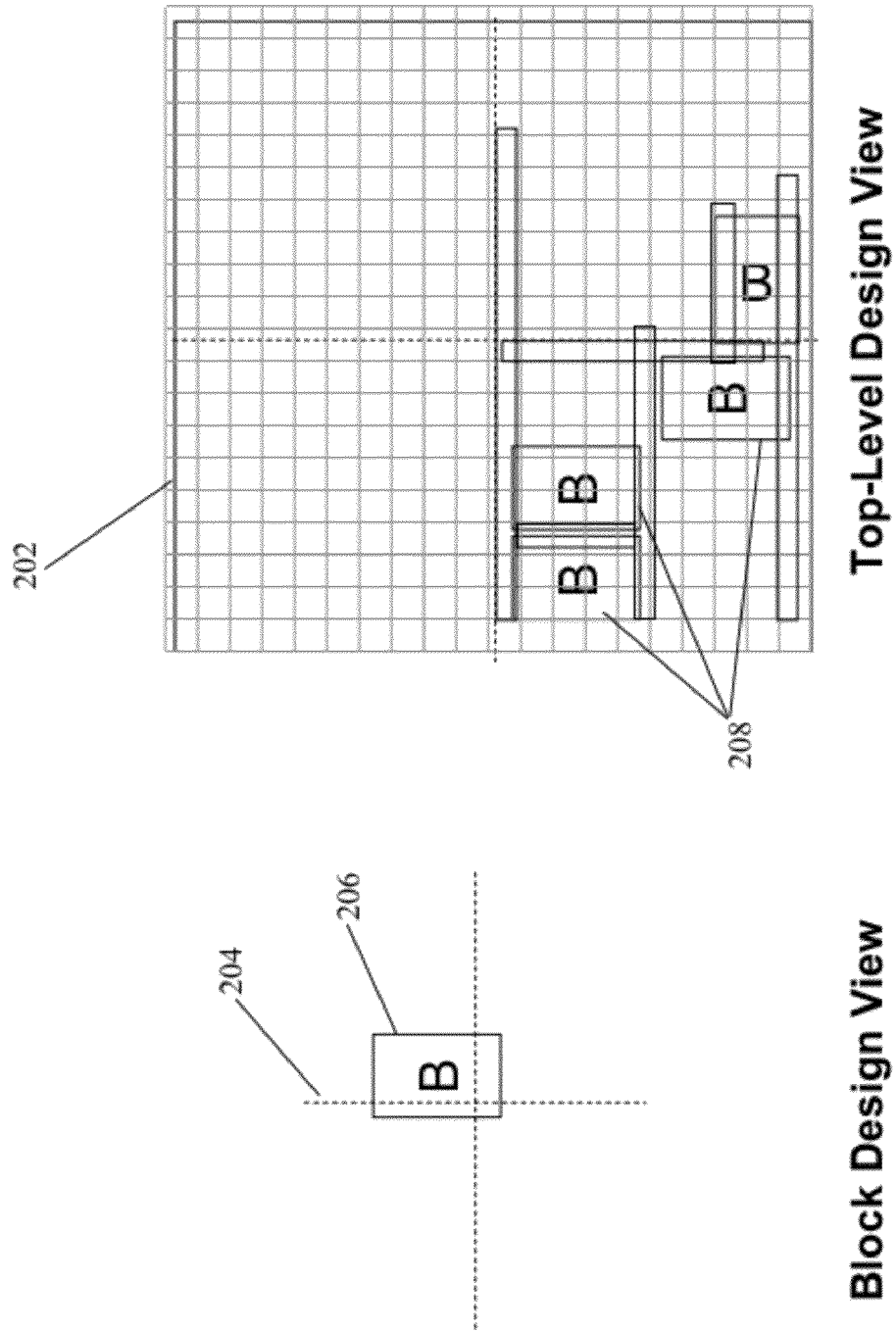
FIG. 2 illustrates a translation between a full-chip domain and a block-level domain.

As illustrated in FIG. 2, embodiments of the invention address these problems by identifying information from the top-level and converting that information to the framework usable by the designer at the block-level. For example, this can be implemented by translating from the coordinate space 202 used at the full-chip level to the coordinate space 204 used locally at the block level. At the full-chip level, the full-chip models may use coordinates and grids based on a full-chip bounding box. For multiple instances 208 of the block, each would undergo individual analysis at the full-chip level, but would all correspond to the same translated information 206 at the block level. The blocks of interest 206 loads in the appropriate shapes and information formats, e.g., using formats such as GDS ("Graphic Data System"), LEF ("Library Exchange Format"), and DEF ("Design Exchange Format").

Therefore, embodiments of the invention operate in the block coordinate system and maps full-chip predictions back into the block design environment as additional cases, allowing the designer to easily evaluate a single design across multiple environments. This is a significant improvement over alternative model-based approaches that operate in the full-chip coordinate system and treat multiple instances of blocks as unique instances, making it difficult to run RC extractions and make corresponding design changes in the block coordinate system.

This approach also provides numerous advantageous over alternative model-based RC extraction solutions that focus on full-chip manufacturing variation in the sign-off flow, where full-chip design information is available, but do not address the design implementation flow (e.g. at the IP or block-level) where full-chip design information is typically not available in the IP or block-level design environment. The invention allows the block designer to estimate the full-chip "context" information, simulate the block in this context of full-chip design, and run the RC extraction and timing based on these simulations.

Moreover, the invention provides the benefits of long-range modeling, but enables the use in a localized approach that is more accurate. This is advantageous as compared to alternative block-level solutions that use rule-based approaches to model manufacturing variations (e.g. simple look-up tables or polynomial equations to capture thickness variation as functions of metal density, line width and space), which do not account for the long-range effects captured by full-chip models.

The present approach could be used by chip design teams to allow designers to maximize performance while ensuring robustness to the specific context of each of the instances on the intended chip, e.g., for internally designed content. While the present approach could be used in multiple contexts, it is not reliant upon a methodology that runs simulations in several different possible contexts in order to make for a robust design in that it uses model predictions for the specific context of each instance.

Figure 3:
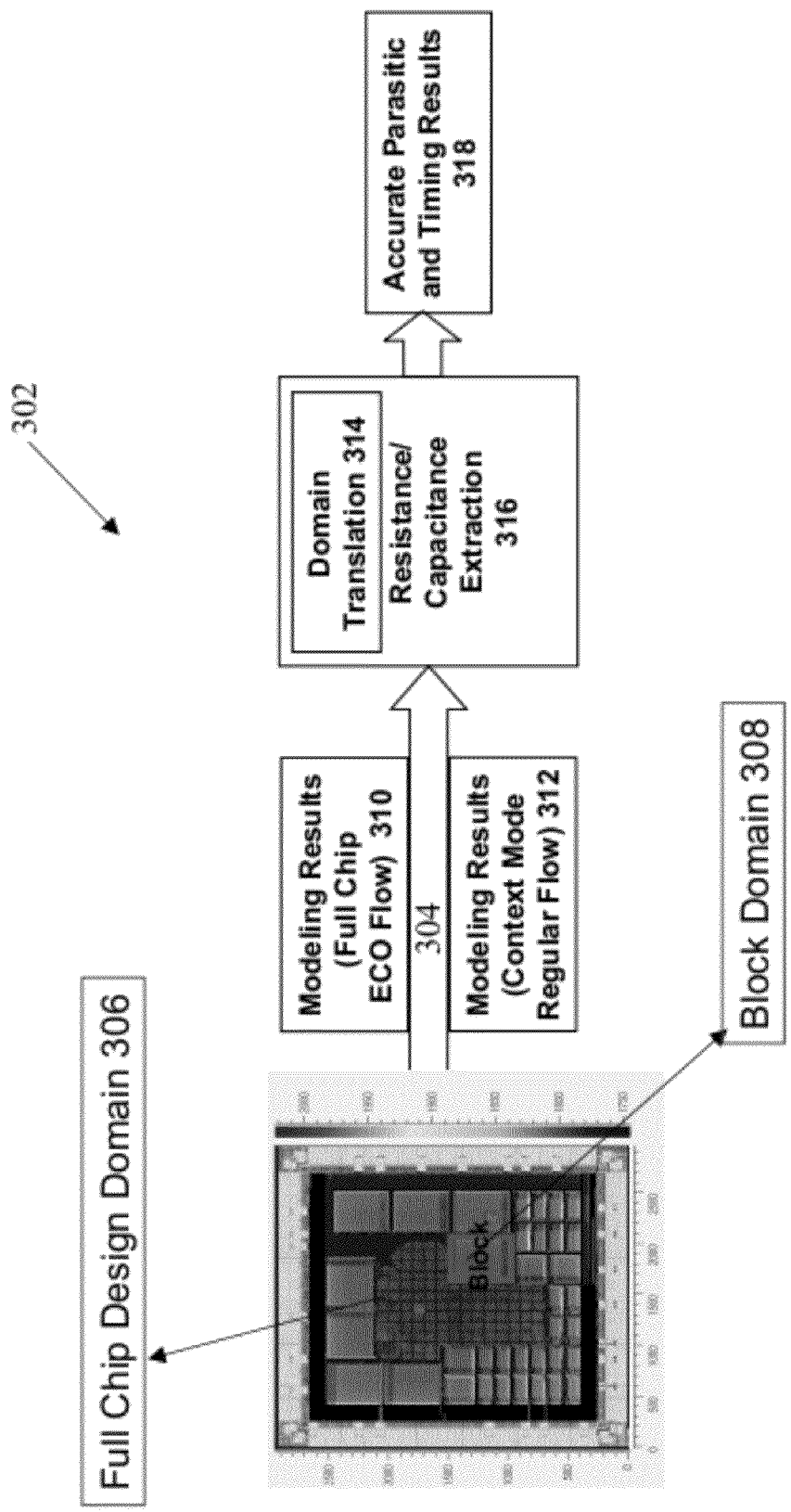
FIG. 3 illustrates an architectural flow for an embodiment of the invention to perform RC extraction.

FIG. 3 illustrates a general architecture 302 for performing RC extraction according to some embodiments of the invention. As noted above, information from the full-chip domain 306 is translated to the block-level domain 308. The process operates by receiving manufacturing model simulation results 304 based on the full-chip design information. The modeling results 304 could be from either a full chip ECO (engineering change order) flow 310 or a context model flow 312, each of which are described in more detail below. For purposes of illustration, the example approach(es) described in this document is illustrated with respect to modeling results based upon geometric extraction and model-based predictions based upon geometries, such as CMP predictions. It is noted, however, that the invention can be applied to any modeling paradigm, and is therefore not to be limited to only the example approaches described and illustrated herein.

Domain translation 314 then occurs to translate the full-chip results to the block-level design space. This can be accomplished, for example, by performing coordinate translations such as shifting, rotating, and/or mirroring to the block-level coordinate system. According to some embodiments, the approach deletes or ignores the portion of the full-chip results not in the context of the block of interest.

Based upon the translated information into the block-level domain, RC extraction 316 is performed from the perspective of the block-level designer to generate analysis results, e.g., parasitic and timing analysis results 318. This results in an environment that is more consistent with the way a block designer would use the flow.

The invention can be used to analyze the results from multiple instances of a block. In a typical RC extraction flow, multiple corner cases are performed on the inputs to RC extraction (e.g. two additional RC extractions are performed to cover the maximum and minimum values for wire thickness). However, the manufacturing variation, and hence RC extraction, for each instance of a block will be different due to the influence of the block's surroundings when placed in the full-chip manufacturing model simulations. Thus, the invention allows a block designer to treat the different RC extraction for each block location as another dimension to their Monte Carlo or corner case analysis.

For example, instead of running an RC extraction for nominal, minimum, and maximum values with one manufacturing simulation result for a given location, the designer may now run nominal, minimum, and maximum cases for each instance of the block, with the instance being another dimension in the Monte Carlo or corner case analysis. If the design is intended to be manufactured on multiple manufacturing processes, e.g., at two manufacturing foundries, this analysis may be extended to run nominal, minimum, and maximum for all instances of the block in the possible manufacturing processes, e.g., by adding two dimensions to the standard corner case analysis.

The present embodiment can be used in an ECO flow, when full chip placement and route are finished or in a design implementation flow where the full-chip layout is possibly incomplete and may need to be estimated. The invention will allow more accurate RC or timing extraction early in the design implementation flow by adopting a model-based approach to account for manufacturing variation.

The preferred embodiment would have the translation from the full-chip design domain to the block-level design domain performed during block-level RC extraction. This allows the changes to be made when RC extraction tools query full-chip manufacturing variation values and in the block design environment. This is the preferred method for multiple block RC extractions. Alternatively, the translation could be performed at the full-chip modeling stage and the results for each instance would be translated and passed to the block-design environment.

The preferred embodiment would allow the block designer to optimize one block design for all the different modeling results of the multiple instances on the full-chip. However, an alternative embodiment would allow the block designer to create unique instances of the block that would be optimized for the modeling results for each placement of the block on the full-chip.

Figure 4:
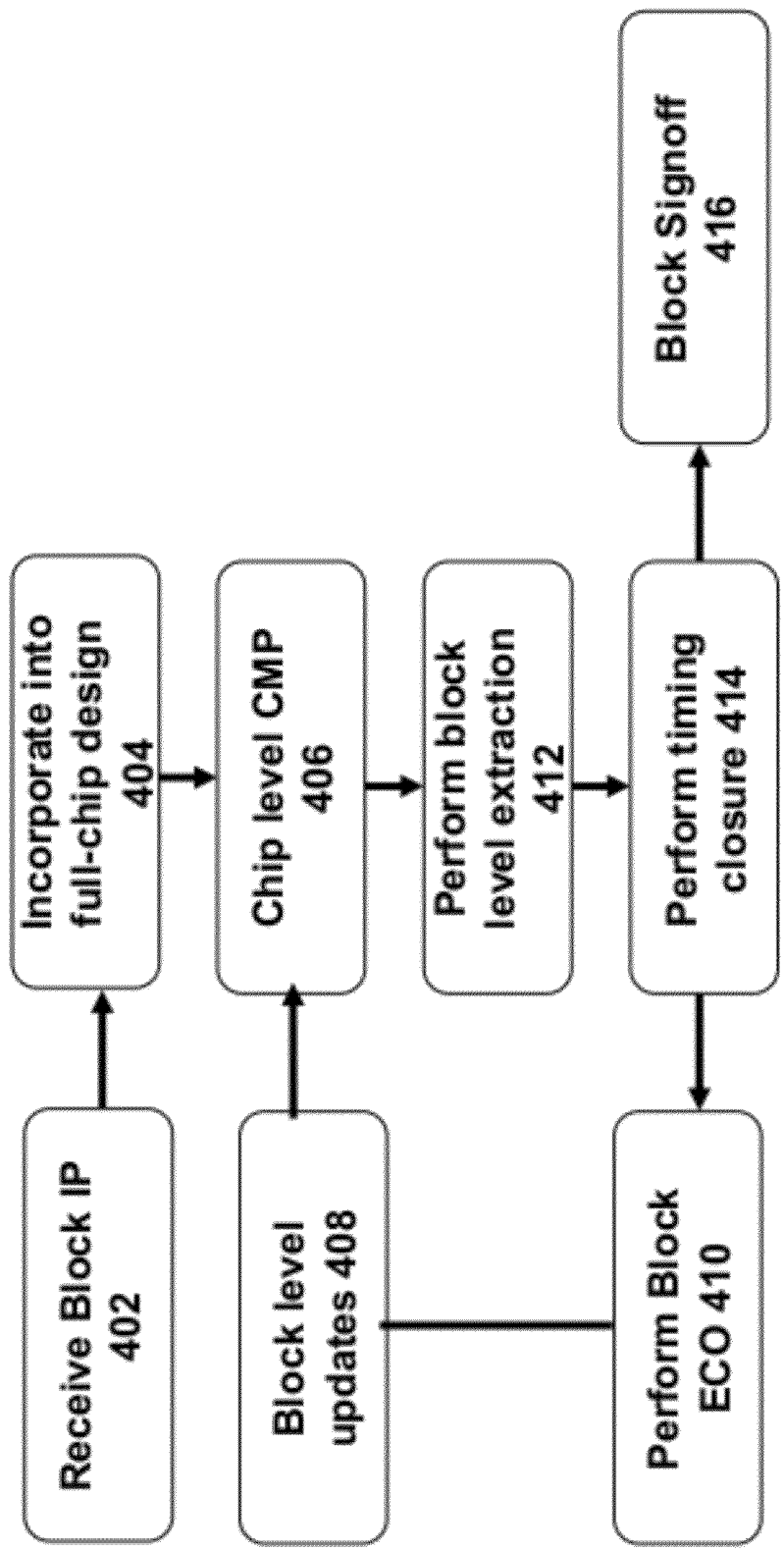
FIG. 4 shows an embodiment of the invention applied to perform ECO operations.

FIG. 4 shows a flowchart of the inventive process/system in the context of an ECO flow according to some embodiments of the invention. At 402, block-level design information or "IP" is received, which is at 404 then incorporated into the full chip-level design. Full-chip CMP processing occurs at 406 to perform geometry extraction and CMP predictions. Block-level updates 408, e.g., based upon an engineering change order performed at 410, is received and is applied to update the full-chip CMP prediction at 406.

Based upon the results from performing extraction and prediction, a results database in a computer readable storage medium is created with the relevant extraction information. The information in the results database at the full-chip level is then translated to the block-level. Block-level RC extraction is then performed at 412.

At 414, timing closure is performed to address any timing issues identified by the RC extraction process. If there are any problems, then another round of block-level ECO updates is performed at 410, and the process is repeated until necessary timing corrections have been completed. Thereafter, block sign-off will occur at 416.

Figure 5:
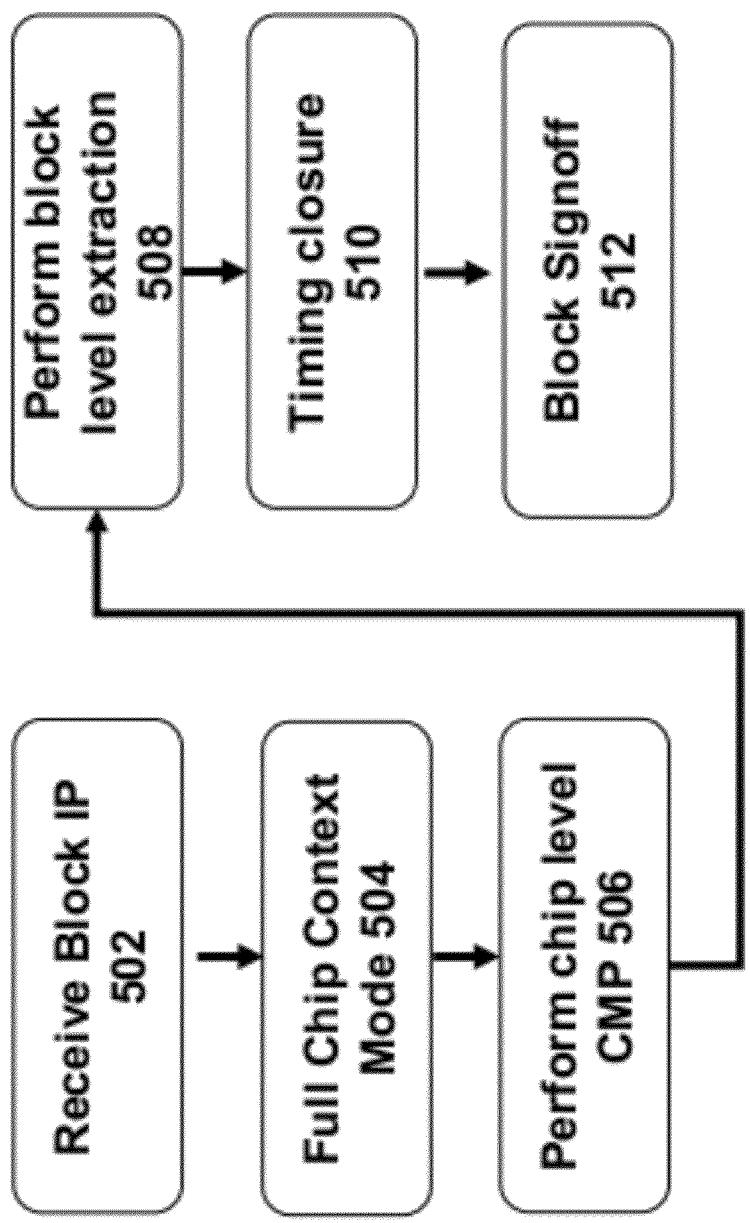
FIG. 5 shows an embodiment of the invention applied to perform RC extraction for full context operations.

FIG. 5 illustrates a flow for applying the invention to the context mode according to some embodiments. At 502, block-level design information is received, which at 504 is then incorporated into the context of the full-chip design.

At 508, full-chip CMP processing occurs to perform geometry extraction and CMP predictions for the chip design. Based upon the results from performing extraction and prediction, a results database is created with the relevant extraction information. The results data may be stored in a computer readable storage medium. The information in the results database at the full-chip level is then translated to the block-level.

At 508, block-level RC extraction is then performed upon the translated information. Timing closure is performed at 510 to address any timing issues identified by the RC extraction process. Thereafter, assuming timing issues are suitably corrected, block sign-off will occur at 512.

Figure 6:
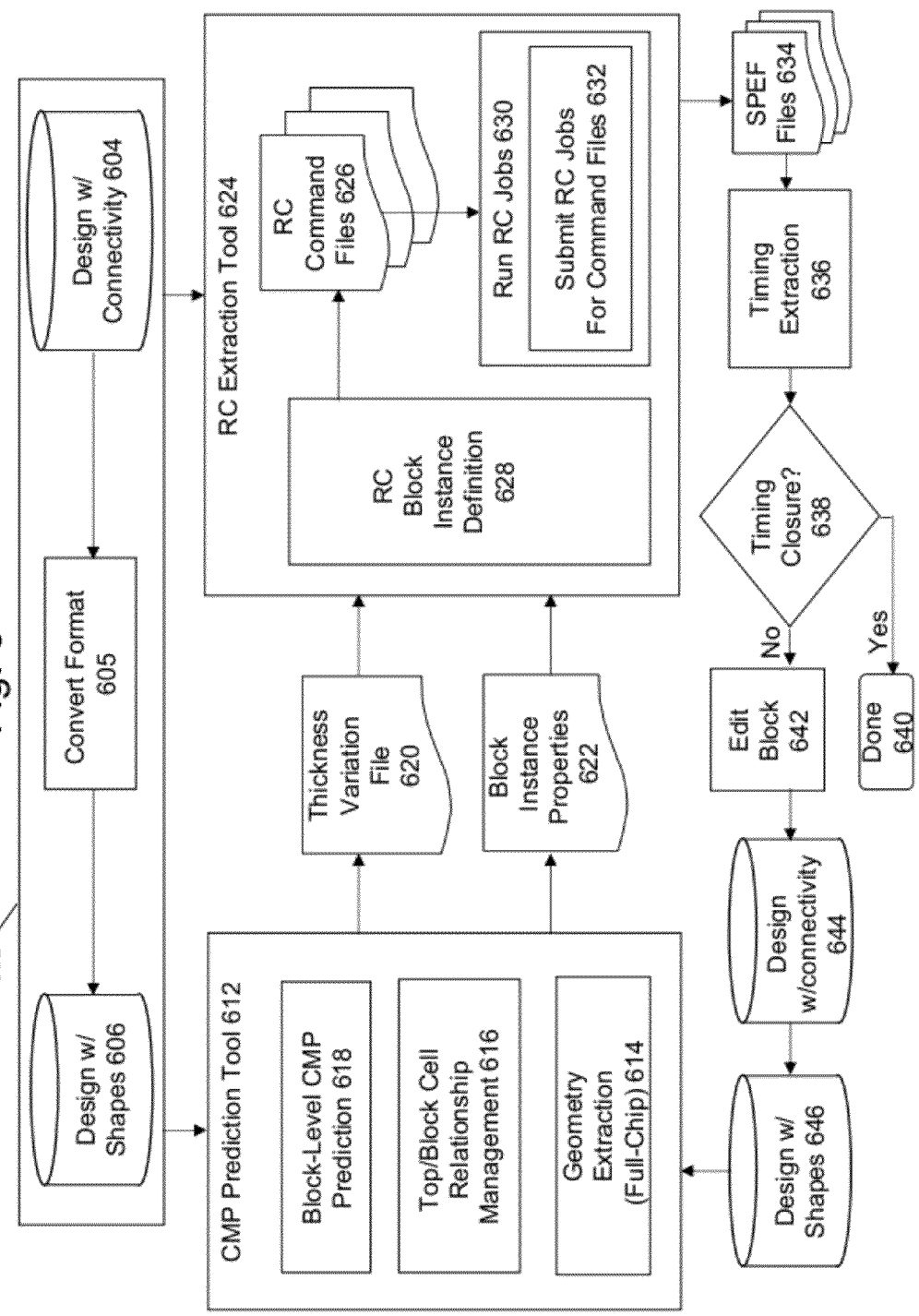
FIG. 6 illustrates a detailed flow for performing RC extraction.

FIG. 6 illustrates a more detailed flow of an embodiment of the invention. The top portion 602 of the diagram shows the top-level design being received. The design information can be received and used in any suitable format. Under certain circumstances, the format of the design information may optionally be converted, at 605, from a first design format with connectivity information 604 to a second design format with shape information 606 to facilitate processing. For example, it is possible that the top-level design is originally in the LEF/DEF format, but is to be converted to the GDS format prior to being used.

The bottom-left portion of the diagram shows the block-level design information being received. Similar to the process for receiving the top-level design information, the format of the block-level design information may optionally be converted from a first format to a second format, e.g., to convert from the LEF/DEF format to the GDS format.

A CMP prediction tool 612 receives the design information. The CMP prediction tool 612 is used to perform geometry extraction at the full-chip level at 614. In addition, the CMP prediction tool 612 provide top level and block level cell relationship management at 616. The CMP prediction tool may also perform block-level CMP prediction at 618 based upon the top-level and block-level design information. A suitable approach for performing this type of prediction is disclosed in U.S. Prov. Application 61/075,095, filed on Jun. 24, 2008 and U.S. Ser. No. 12/490,181, entitled "METHOD AND SYSTEM PERFORMING CIRCUIT DESIGN PREDICTIONS", filed on even date herewith, which are hereby incorporated by reference in their entirety.

The output from the CMP prediction tool 612 includes thickness variation information 620 based upon the CMP analysis, e.g., in the form of a thickness variation file. In addition, the CMP prediction tool 612 generates information 622 about properties for the block instances, e.g., also in the form of a file.

An RC extraction tool 624 receives the thickness variation information 620 and block instance properties 622 to generate command instructions for the RC extraction tool for the block instances, e.g., to create block instance definitions 628 in the command language for the QRC RC extraction tool. This is used, for example, to generate a set of command files 626 that contain the specific instructions for each instance in the design being analyzed. In an alternate embodiment, the different instances could be run without creating multiple CCL files.

These are run as RC extraction jobs at 630 and submitted at 632 to perform RC analysis on the blocks of interest. Note that the RC analysis can be handled for multiple instances of a block, either sequentially or in parallel. If in parallel, then QRC jobs are sent to multiple concurrent processes, threads, or to distributed processing entities.

The results of the RC analysis are collected together, e.g., in SPEF (standard parasitic exchange format) files 634. Timing extraction is performed at 636 to generate timing analysis data for the design. Timing closure is performed at 638 to identify any timing issues identified by the RC and timing extraction process.

If there are no timing problems, then the process ends at 640. However, if there are any identified problems, then block-level updates are performed at 642 to attempt to correct the timing problems. The design information with connectivity 644 and/or design information with shapes 646 are sent to the CMP prediction tool 612. The above-described process is repeated until necessary timing corrections have been completed. Thereafter, block sign-off will occur.

System Architecture Overview

Figure 7:
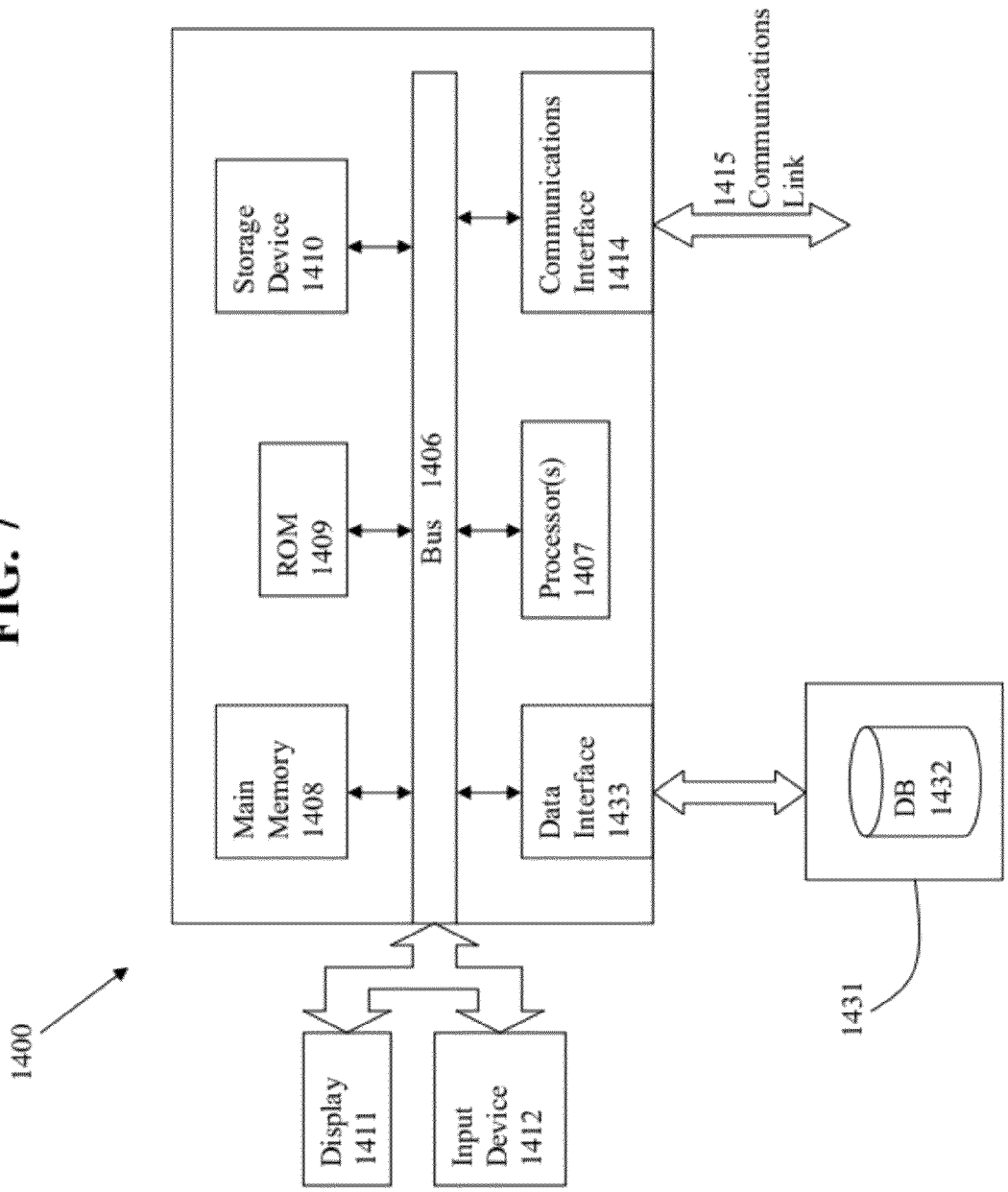
FIG. 7 shows an architecture of an example computing system with which the invention may be implemented.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may access data in a database 1432 that is located on an external storage device 1431 through a data interface 1433.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for processing electronic design automation information about an electronic design, comprising:
   using at least one processor of a computing system to perform a process, the process comprising:
   receiving design information for an electronic design, wherein the design information comprises full-chip design domain information;
   identifying a block within the design information; and
   using the at least one processor to translate the full-chip design domain information to block-level design domain information corresponding to the block, in which the full-chip design domain information comprises manufacturing variation in a full-chip design coordinate space that is translated to a local coordinate space associated with the block.

2. The computer implemented method of claim 1, wherein the full-chip design domain information or the block-level design domain information comprises design coordinate information, design placement information, or orientation information.

3. The computer implemented method of claim 1, wherein translating the full-chip design domain information to the block-level design domain information comprises shifting a block origin in a full-chip coordinate space to the same coordinate system used in the block-level design.

4. The computer implemented method of claim 1, wherein the design information comprises information used for modeling manufacturing variations.

5. The computer implemented method of claim 4, wherein the act of modeling manufacturing variations is based at least in part on the full-chip design information in an engineering change order flow or at least in part on estimated full-chip design information to simulate a context of the block for use in a block design flow.

6. The computer implemented method of claim 5, in which a context mode is employed that comprises simplified design information or estimates for modeling prediction.

7. The computer implemented method of claim 1 further comprising applying model prediction results in a stage of electronic design, including at least one of placement, routing, or post-route optimization.

8. The computer implemented method of claim 1 further comprising passing block-level design information between a model calculation tool, an RC extraction tool, or a timing computation tool.

9. The computer implemented method of claim 1 further comprising treating multiple block instances as variations of nominal circuit performance.

10. The computer implemented method of claim 1 further comprising treating multiple manufacturing processes as variations of nominal circuit performance.

11. The computer implemented method of claim 9 or 10 in which RC extraction is based at least in part on multiple instances or dimensions in Monte Carlo or corner case analyses.

12. The computer implemented method of claim 1 wherein the design information comprises topographical information, feature dimension variation, or feature depth variation.

13. The computer implemented method of claim 1 further comprising performing block-level extraction.

14. A system for processing electronic design automation information about an electronic design, comprising:
a memory for holding executable program code; and
a processor communicatively coupled to the memory that executes the executable program code to:
receive design information for an electronic design, wherein the design information comprises full-chip design domain information;
identify a block within the design information; and
use the processor to translate the full-chip design domain information to block-level design domain information corresponding to the block, wherein the full-chip design domain information comprises manufacturing variation in a full-chip design coordinate space that is translated to a local coordinate space associated with the block.

15. The system of claim 14, wherein the full-chip design domain information or the block-level design domain information comprises design coordinate information, design placement information, or orientation information.

16. The system of claim 14, wherein translating the full-chip design domain information to the block-level design domain information comprises shifting a block origin in a full-chip coordinate space to the same coordinate system used in the block-level design.

17. The system of claim 14, wherein the design information comprises information used for modeling manufacturing variations.

18. The system of claim 17, wherein modeling manufacturing variations is based at least in part on the full-chip design information in an engineering change order flow or at least in part on estimated full-chip design information to simulate a context of the block for use in a block design flow.

19. The system of claim 18, in which a context mode is employed that comprises simplified design information or estimates for modeling prediction.

20. The system of claim 14 in which the processor further executes the executable program code to apply model prediction results in a stage of electronic design, the stage including at least one of placement, routing, or post-route optimization.

21. The system of claim 14 in which the processor further executes the executable program code to pass block-level design information between a model calculation tool, an RC extraction tool, or a timing computation tool.

22. The system of claim 14 in which the processor further executes the executable program code to treat multiple block instances as variations of nominal circuit performance.

23. The system of claim 14 in which the processor further executes the executable program code to treat multiple manufacturing processes as variations of nominal circuit performance.

24. The method of claim 14 wherein the design information comprises topographical information, feature dimension variation, or feature depth variation.

25. The method of claim 14 in which the processor further executes the executable program code to perform block-level extraction.

26. A computer program product embodied on a non-transitory computer usable medium, the non-transitory computer readable medium having stored thereon a sequence of instructions which, when executed by a processor, causes the processor to execute a method for processing electronic design automation information about an electronic design, the method comprising:
using the processor of a computing system to perform a process, the process comprising:
receiving design information for an electronic design, wherein the design information comprises full-chip design domain information;
identifying a block within the design information; and
using the processor to translate the full-chip design domain information to block-level design domain information corresponding to the block, in which the full-chip design domain information comprises manufacturing variation in a full-chip design coordinate space that is translated to a local coordinate space associated with the block.

27. The computer program product of claim 26, wherein the full-chip design domain information or the block-level design domain information comprises design coordinate information, design placement information, or orientation information.

28. The computer program product of claim 26, wherein translating the full-chip design domain information to the block-level design domain information comprises shifting a block origin in a full-chip coordinate space to the same coordinate system used in the block-level design.

29. The computer program product of claim 26, wherein the design information comprises information used for modeling manufacturing variations.

30. The computer program product of claim 29, wherein the act of modeling manufacturing variations is based at least in part on the full-chip design information in an engineering change order flow or at least in part on estimated full-chip design information to simulate a context of the block for use in a block design flow.

31. The computer program product of claim 30, in which a context mode is employed that comprises simplified design information or estimates for modeling prediction.

32. The computer program product of claim 26, the process further comprising applying model prediction results in a stage of electronic design, the stage including at least one of placement, routing, or post-route optimization.

33. The computer program product of claim 26, the process further comprising passing block-level design information between a model calculation tool, an RC extraction tool, or a timing computation tool.

34. The computer program product of claim 26, the process further comprising treating multiple block instances as variations of nominal circuit performance.

35. The method of claim 26, the process further comprising treating multiple manufacturing processes as variations of nominal circuit performance.

36. The computer program product of claim 26 wherein the design information comprises topographical information, feature dimension variation, or feature depth variation.

37. The computer program product of claim 26, the process further comprising performing block-level extraction.

* * * * *